(12) United States Patent
Hao

(10) Patent No.: US 7,244,136 B2
(45) Date of Patent: Jul. 17, 2007

(54) ZIF ELECTRICAL CONNECTOR

(75) Inventor: Yin Hao, Shanghai (CN)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/542,882

(22) PCT Filed: Jan. 29, 2004

(86) PCT No.: PCT/US2004/002818

§ 371 (c)(1),
(2), (4) Date: Jul. 19, 2005

(87) PCT Pub. No.: WO2004/068639

PCT Pub. Date: Aug. 12, 2004

(65) Prior Publication Data

US 2006/0172581 A1    Aug. 3, 2006

(30) Foreign Application Priority Data

Jan. 30, 2003   (CN) .......................... 03 2 02284 U

(51) Int. Cl.
*H01R 4/50* (2006.01)
(52) U.S. Cl. .................................................. 439/342
(58) Field of Classification Search ............... 439/342, 439/264, 266, 259
See application file for complete search history.

(56) References Cited

U.S. PATENT DOCUMENTS

| 5,482,471 A | * | 1/1996 | Mori et al. ................. 439/263 |
| 6,338,639 B1 | * | 1/2002 | Trout et al. ................. 439/342 |
| 6,435,893 B1 | * | 8/2002 | Kasahara .................... 439/342 |
| 6,482,022 B2 | * | 11/2002 | Trout et al. ................. 439/342 |
| 2002/0019159 A1 | * | 2/2002 | Trout et al. ................. 439/342 |

* cited by examiner

*Primary Examiner*—Tulsidas C. Patel
*Assistant Examiner*—Harshad C Patel
(74) *Attorney, Agent, or Firm*—Robert J. Zeitler

(57) ABSTRACT

A ZIF electrical connector comprises a base and a sliding cover. The base defines a plurality of terminal-receiving cavities receiving a plurality of conductive terminals. The cover moves along a first direction and defines a plurality of through holes corresponding to the terminal-receiving cavities. The base defines a recess portion partly slant with the first direction. A slider moves in the recess portion and has a body and part of the body intervening with the cover. A drive means extends into the insulative housing and contacts with the body of the slider. When the drive means operates out of the insulative housing, the drive means drives the body to move along a second direction slant the first direction and further drive the cover to displace along the first direction between a first position and a second position.

14 Claims, 14 Drawing Sheets

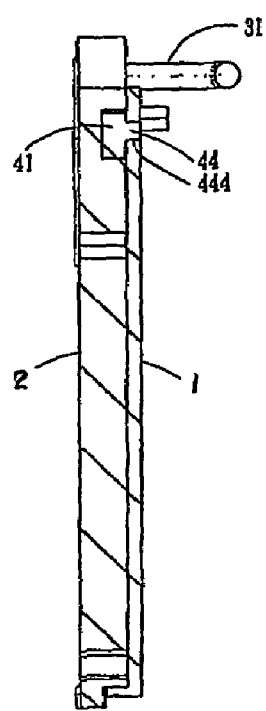 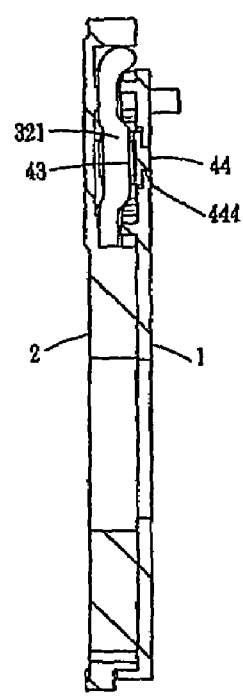 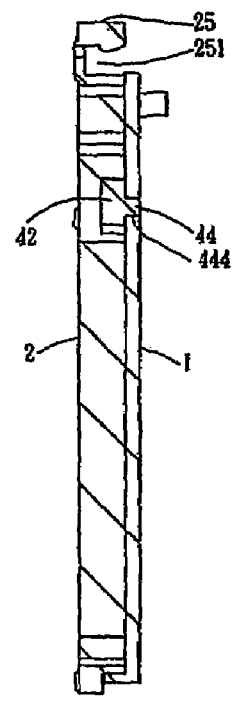
FIG. 9-2     FIG. 9-3     FIG. 9-4

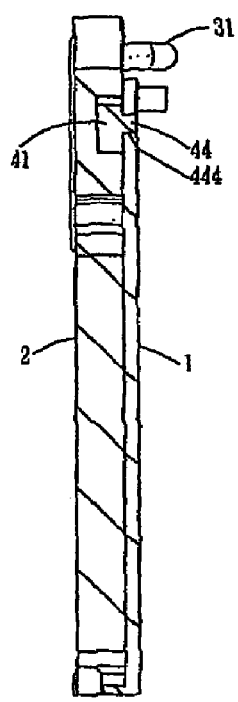 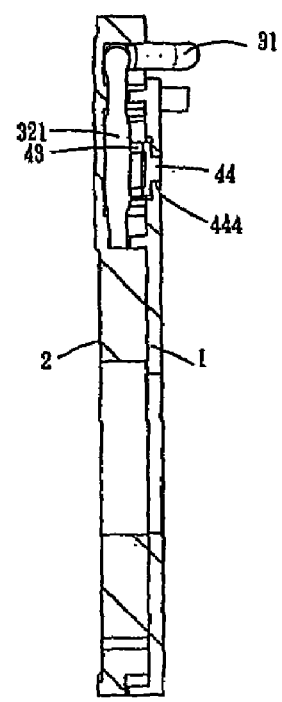 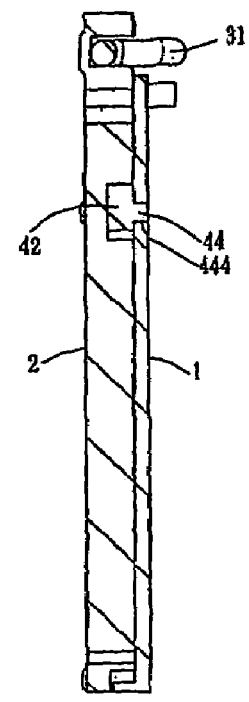
FIG. 10-2　　FIG. 10-3　　FIG. 10-4

US 7,244,136 B2

ZIF ELECTRICAL CONNECTOR

FIELD OF THE INVENTION

The present invention generally relates to an electrical connector and, more particularly, to a zero insertion force ("ZIF") electrical connector.

BACKGROUND OF THE INVENTION

Referring to FIGS. 11 to 12, a conventional zero insertion force ("ZIF") electrical connector 800 used in computer for electrically interconnecting a central processing unit ("CPU") and a mainboard used in computer device. The conventional ZIF electrical connector 800 comprises a base 803 receiving a plurality of conductive terminals (not shown), a cover 805 and a driver 807. The cover 805 is slideably assembled onto the base 803 along front and rear direction. A cam portion of the driver 807 is received in a recess defined by the cover 805 and the base 803 at the rear (not shown). A handle 808 of the driver 807 is formed at the right of the ZIF electrical connector 800.

However, because the Integrated circuit ("IC") manufacturers have designed new CPU, the conventional ZIF electrical connectors cannot suit for connecting. So the present invention provides an improved ZIF electrical connector to satisfy the new requirements.

SUMMARY OF THE INVENTION

An object of the present invention is to provide a ZIF electrical connector which accord with new specification brought by IC manufacturer.

Another object of the present invention is to provide a ZIF electrical connector in which a drive means of the ZIF electrical connector indirectly drives a cover of the ZIF electrical connector and makes the cover displace.

A further object of the present invention is to provide a ZIF electrical connector in which a slider of the ZIF electrical connector moves along a slant direction of the cover moving.

A further object of the present invention is to provide a ZIF electrical connector in which ensures each pin of CPU steadily contact with the corresponding conductive terminal of the ZIF electrical connector.

To obtain the above objects, the ZIF electrical connector of the present invention defines a drive means at the side of moving direction of the cover.

The ZIF electrical connector has a slider contacting with one end of the drive means and when the drive means pivots, the drive means drives the slider to displace and further drives the cover intervening with the slider to move along the setting direction in advance.

The base of the ZIF electrical connector defines a recess portion slant with the moving direction of the cover, so that the slider received therein slant move along the recess portion.

The ZIF electrical connector of the present invention comprises an insulative housing consisted of the cover slideably assembling onto the base. The cover moves between a first position and a second position and along a first direction. The base defines a plurality of terminal-receiving cavities receiving a plurality of conductive terminals and also defines the recess portion partly slant with the first direction. The cover defines a plurality of through holes corresponding to the terminal-receiving cavities. The ZIF electrical connector also comprises the slider moving in the recess portion and intervening with the cover, and the drive means having a portion contacting with the slider. The drive means can drive the slider to move along a second direction slant the first direction and further drive the cover to displace along the first direction when the drive means is forced.

The slider has a body and part of the body intervening with the cover.

The drive means has an operating portion defined at side of the insulative housing crossing the first direction and a cam member extending into the insulative housing and contacting with the body of the slider. The cam member drives the body to move along the second direction slant the first direction when the operating portion is forced.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIGS. 9–1 is a perspective-assembled view of the ZIF electrical connector of the present invention in which the drive means turns to the left and the cover is at the first position;

FIGS. 9–2 is a sectional view of FIGS. 9–1 along I—I line;

FIGS. 9–3 is a sectional view of FIGS. 9–1 along II—II line;

FIGS. 9–4 is a sectional view of FIGS. 9–1 along III—III line;

FIGS. 10–1 is a perspective-assembled view of the ZIF electrical connector of the present invention in which the drive means turns to the right and the cover is at the second position;

FIGS. 10–2 is a sectional view of FIGS. 10–1 along IV—IV line;

FIGS. 10–3 is a sectional view of FIGS. 10–1 along V—V line;

FIGS. 10–4 is a sectional view of FIGS. 10–1 along VI—VI line;

Figure 1:
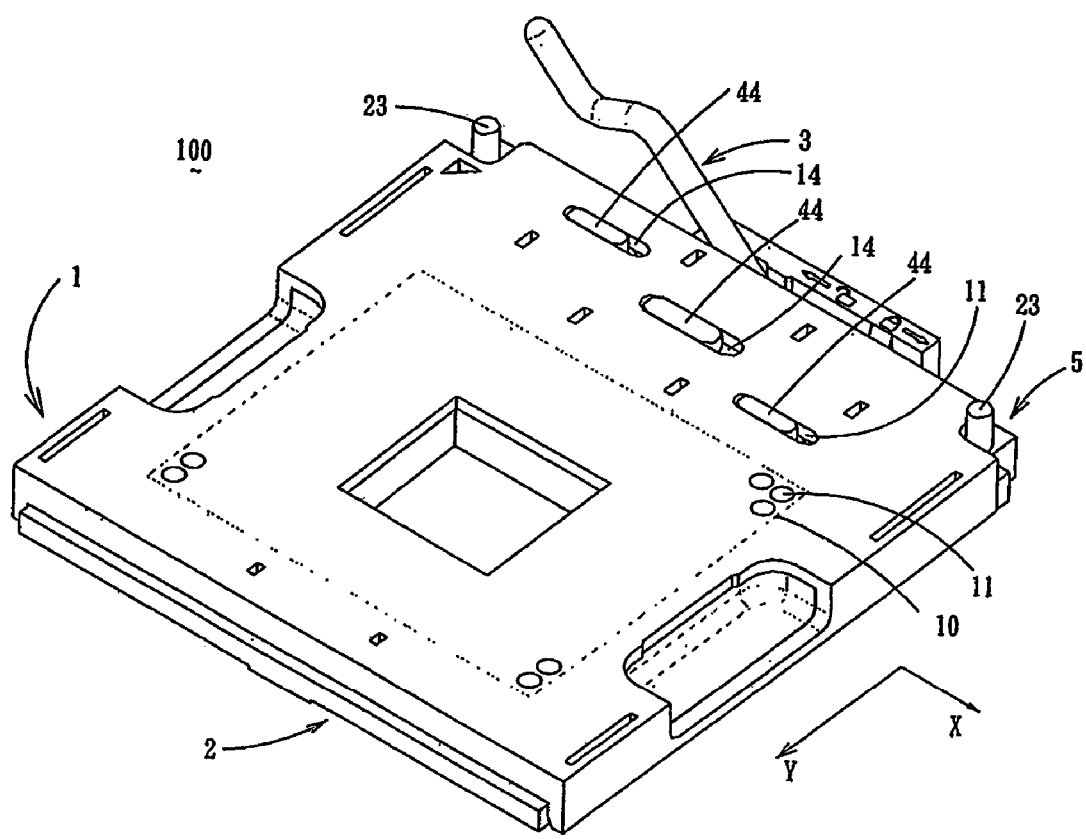
FIG. 1 is a perspective view of a ZIF electrical connector of the present invention.

DETAILED DESCRIPTION OF THE
PREFERRED EMBODIMENTS

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 2:
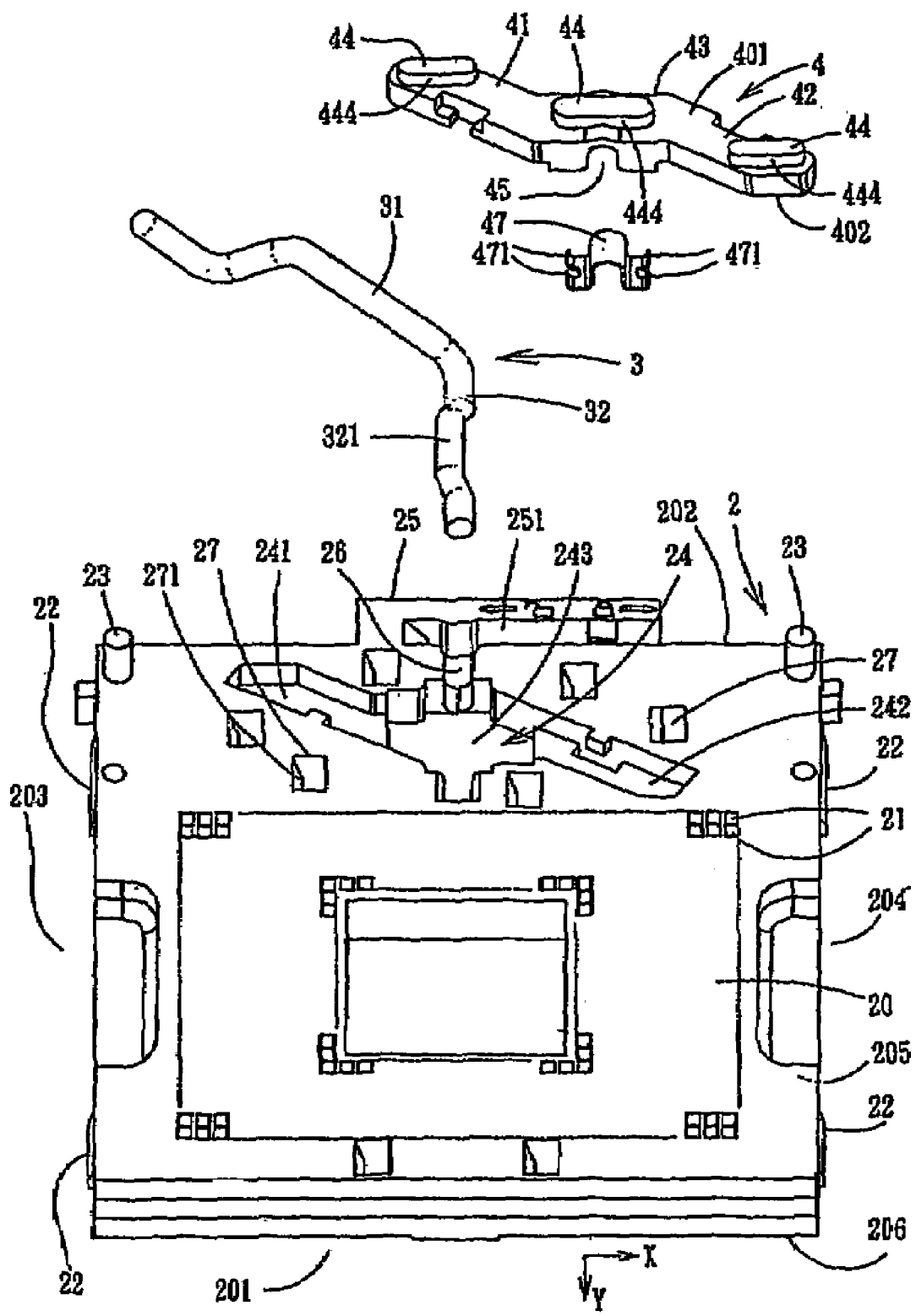
FIG. 2 is a perspective view of a base, a drive means and a slider of the ZIF electrical connector of the present invention not assembled.

Referring to FIG. 1 and FIG. 2, a zero insertion force ("ZIF") electrical connector 100 of the present invention (short for electrical connector) comprises an insulative housing 5 consisted of a cover 1 and a base 2, a drive means 3, a plurality of conductive terminals and a slider 4.

Figure 4:
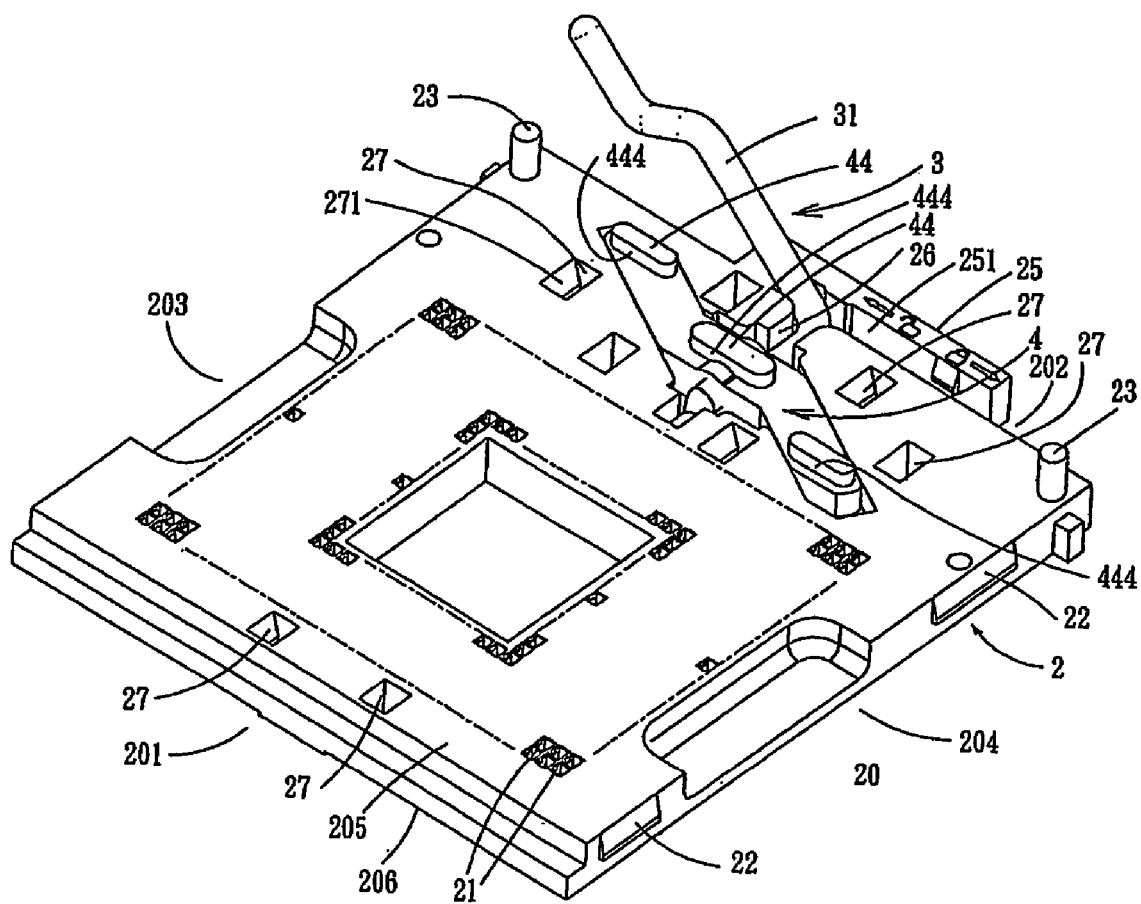
FIG. 4 is a perspective-assembled view of FIG. 2.

Referring to FIG. 2, in this embodiment, the base 2 comprises a front end 201, a rear end 202, a left end 203, a right end 204, a top face 205 and a bottom face 206. The front end 201 and the rear end 202 define a terminal-receiving area 20 therebetween. The terminal-receiving area 20 defines a plurality of terminal-receiving cavities 21 through the top face 205 and the bottom face 206 arraying therein. Each terminal-receiving cavity 21 receives a conductive terminal (not shown). The front end 201 and rear end 202 of the base 2 define a first direction (the cover 1 moving direction, said as follow) therebetween. Convenient for illuminating, the base 2 defines a fictitious X-axis and Y-axis, and the first direction is Y-axis direction. The base 2 respectively defines a cuneal portion 22 interval at the left and the right side thereof. In this embodiment, the left and the right side of the base 2 respectively defines two cuneal portions 22 (referring to FIG. 2). Referring to FIG. 4, the rear end 202 of the base 2 respectively defines a post 23 at the left and the right side thereof to prevent the cover 1 and the base 2 relatively excessively backwards displacing.

The base 2 defines a recess portion 24 downward depressed from the top face 205 of the base 2 and between the rear boundary of the terminal-receiving area 20 and the rear end 202. The recess portion 24 is substantially toward a second direction slant with the first direction. In this embodiment, the recess portion 24 is slant from the top left to the bottom right and has a first slant recess 241, a second slant recess 242 and a transverse recess 243 connecting with two slant recesses 241, 242. The slope of the first slant recess 241 and the second slant recess 242 is all same with the second direction. The transverse recess 243 is defined along the X-axis and the first slant recess 241 is at the top left thereof and the second slant recess 242 is at the bottom right thereof The transverse recess 243 is defined between two slant recesses 241, 242 and connecting with two slant recesses 241, 242.

The rear end 202 of the base 2 extends a receiving base 25 rearward that defines an elongate groove 251 paralleled to the X-axis. The receiving base 25 connects with the transverse recess 243 of the recess portion 24 through a securing slot 26 paralleled to the Y-axis. The securing slot 26 extends forward from the elongate groove 251 of the receiving base 25 along the Y-axis and is through the transverse recess 243 of the recess portion 24 and into the top face 205 of the base 2, its function said as follow.

The recess portion 24 receives a slider 4. In this embodiment, the slider 4 has a body similar with the recess portion 24. The slider has a first body 41, a second body 42 and a transverse body 43 connecting with the first body 41 and the second body 42. The first body 41 is received in the first slant recess 241, the second body 42 is received in the second slant recess 242 and the transverse body 43 is received in the transverse recess 243. The parts of the body (the first body, the second body and the transverse body) 41, 42, 43 are shorter than corresponding recess (the first slant recess, the second slant recess and the transverse recess) 241, 242, 243. Therefore, the slider 4 can move along the second direction slant with the first direction in the recess portion 24.

Figure 3:
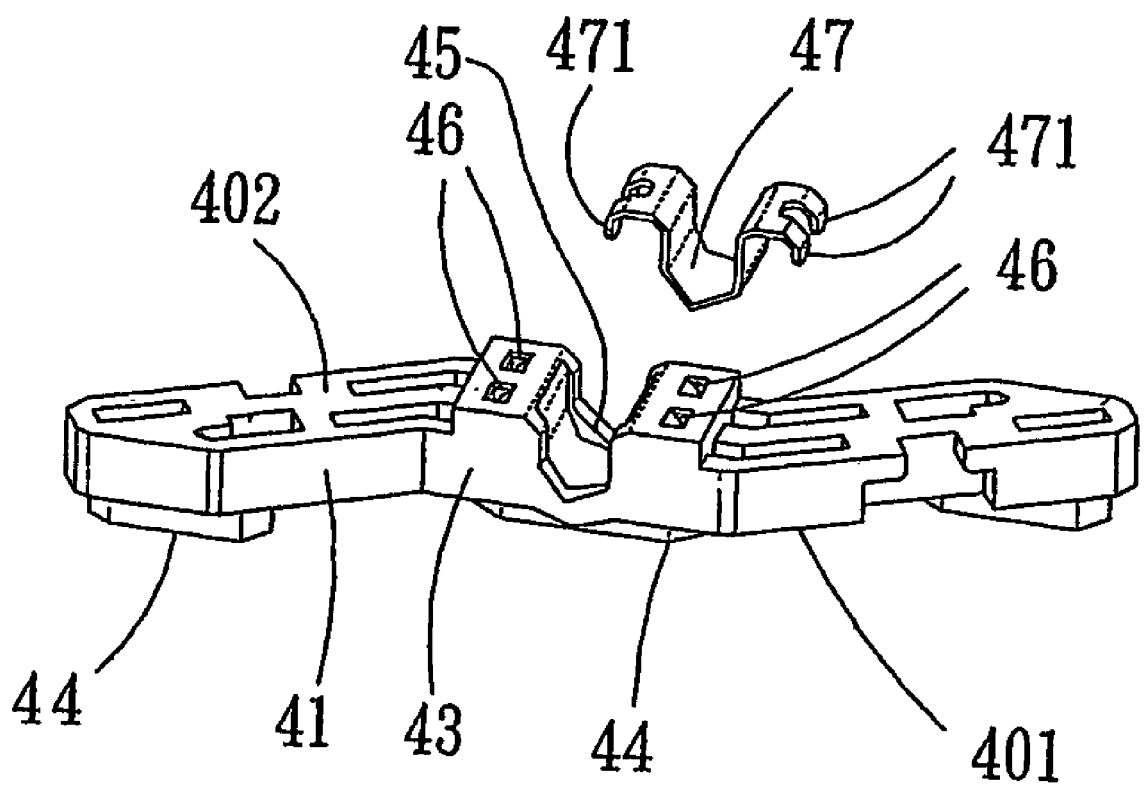
FIG. 3 is a perspective view of the slider and a wearable member of the ZIF electrical connector of the present invention not assembled.

Referring to FIG. 2 and FIG. 3, the slider 4 has a top surface 401 and a bottom surface 402. The top surface 401 distant defines three elliptic protrusions 44 paralleled to the X-axis. In this embodiment, three elliptic protrusions 44 are respectively formed on the first body 41, the second body 42 and the transverse body 43. The elliptic protrusion 44 has a long axis and a front surface 444 of the long axis is paralleled to the X-axis. The function of the elliptic protrusion 44 and the front surface 444 will be illuminated as follow. The bottom surface 402 of the transverse body 43 depresses a U-shaped groove 45 along a short axis thereof and defines two securing holes 46 at each side of the U-shaped groove 45 for fastening a wearable member 47. The wearable member 47 is U-shaped and made of metal and received in the U-shaped groove 45 of the bottom surface 402 of the transverse body 43. Two U-shaped sidewalls (not labeled) of the wearable member 47 respectively integrated extend a pair of securing legs 471 corresponding to the securing holes 46. When the wearable member 47 is received in the U-shaped groove 45, the securing legs 471 corresponding insert into the securing holes 46 so as to make the wearable member 47 fasten in the U-shaped groove 45.

The base 2 defines a plurality of orientating holes 27 through the top face 205 and the bottom face 206 out of the terminal-receiving area 20. In this embodiment, the orientating hole 27 is rectangle. Some of the orientating holes 27 are defined between the rear boundary of the terminal-receiving area 20 and the rear end 202. Some of the orientating holes 27 are defined between the front boundary of the terminal-receiving area 20 and the front end 201. A block 271 is transverse defined in each orientating hole 27 and not close the orientating hole 27.

Referring to FIG. 2, a drive means 3, preferably made of metal, comprises an operating portion and a cam member. In this embodiment, the drive means 3 is a L-shaped pole and the operating portion is a first arm 31 and the cam portion is a second arm 32 having a cam member 321.

Referring to FIG. 4, the second arm 32 of the drive means 3 is put in the securing slot 26, the cam member 321 is in the transverse recess 243 and free end of the second arm 32 extends into the base 2. After that, the slider 4 assembled with the wearable member 47 in the U-shaped groove 45 thereof is put in the recess portion 24 and the cam member 321 of the drive means 3 is in the U-shaped wearable member 47 so that however the cam member 321 of the drive means 3 turn will not fray the slider 4.The second arm 32 of the drive means 3 is put in the securing slot 26 and the first arm 31 of the drive means 3 is in the receiving base 25 of the rear end 202 of the base 2. The first arm 31 pivots from the left to the right and reverse (referring to FIG. 7 and FIG. 8). In this embodiment, when the first arm 31 pivots to the right, part of the first arm 31 is received in the elongate groove 251 paralleled to the X-axis so that the first arm 31 supports the rear end 202 of the base 2 (referring to FIG. 8).

Figure 5:
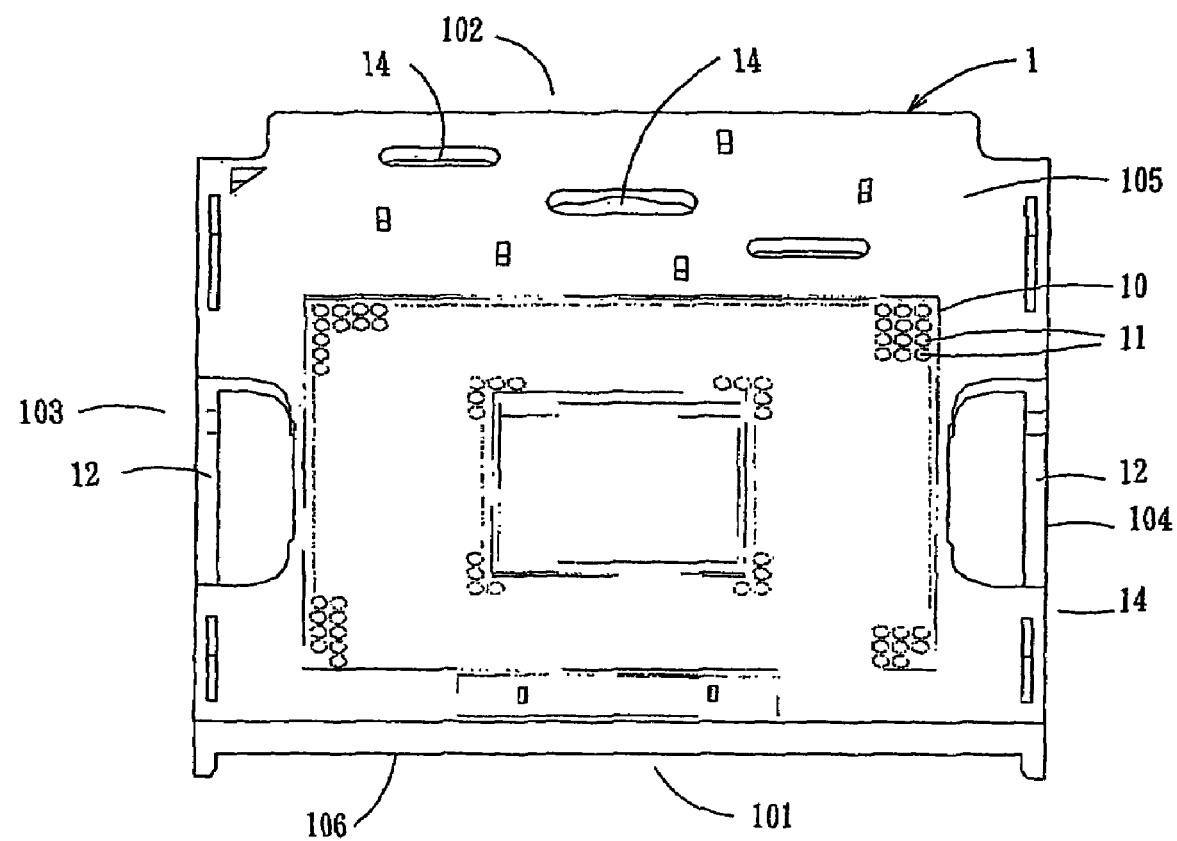
FIG. 5 is a top view of a cover of the ZIF electrical connector of the present invention.
Figure 6:
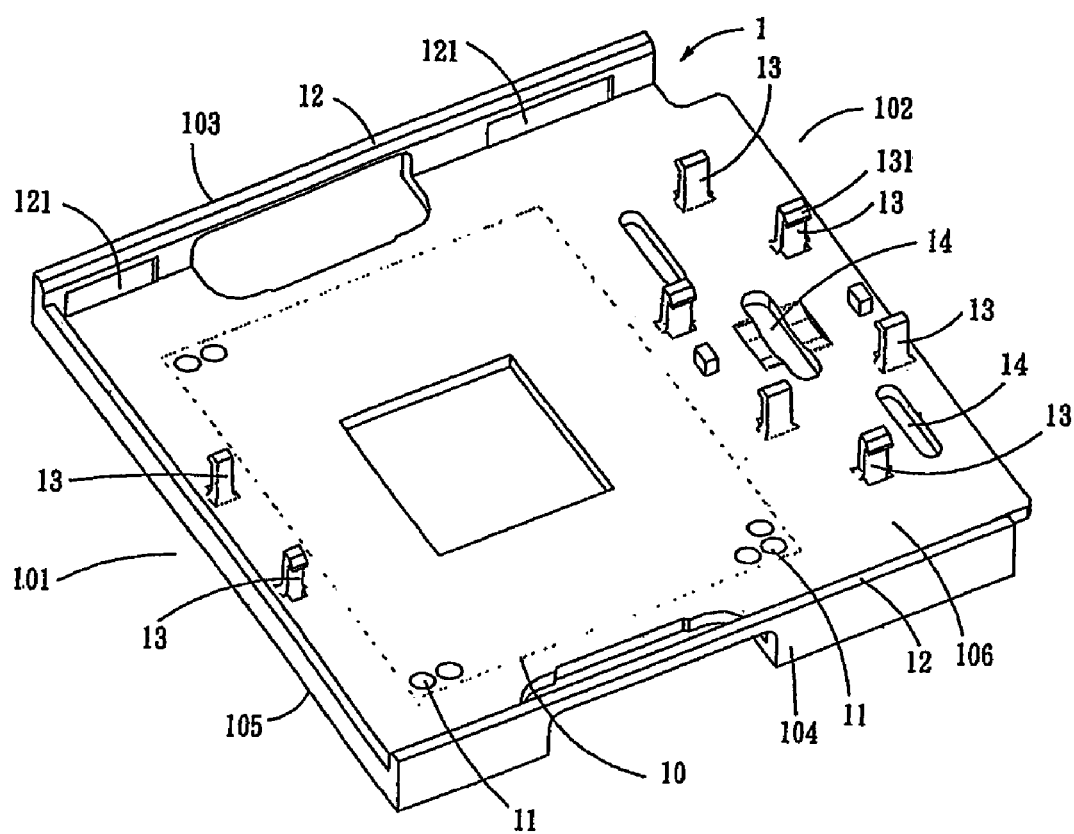
FIG. 6 is a perspective view of a cover of the ZIF electrical connector of the present invention shown the bottom thereof.

Referring FIG. 1, FIG. 5 and FIG. 6, the cover 1 is slideably assembled onto the base 2 along the first direction and comprises a front end 101, a rear end 102, a left end 103, a right end 104, a top face 105 and a bottom face 106. The cover 1 defines a pin-receiving area 10 corresponding to the terminal-receiving area 20 of the base 2. The terminal-receiving area 10 defines a plurality of through holes 11 through the top face 105 and the bottom face 106 arraying therein corresponding to the terminal-receiving cavities 21. A pin of a central processing unit ("CPU") (not shown) respectively inserts in the through holes 11 and extends in the corresponding terminal-receiving cavity 21 of the base 2.

The left end 103 and the right end 104 of the cover 1 respectively extend downward a vertical portion 12 and each vertical portion 12 defines two receiving grooves 121 at inside thereof corresponding to the cuneal portions 22 of the base 2. The receiving groove 121 is longer than the cuneal portion 22. When the cover 1 and the base 2 are assembled to an insulative housing 5, the cuneal portion 22 of the base 2 is locked in the receiving groove 121 of the cover 1 to prevent the cover 1 breaking away from the base 2. And because the receiving groove 121 is longer than the cuneal portion 22, sliding of the cover 1 is not affected.

The bottom face 106 of the cover 1 respectively downward defines an orientating peg 13 corresponding to the orientating hole 27 of the base 2 between the rear boundary of the terminal-receiving area 10 and the rear end 102, and between the front boundary of the terminal-receiving area 10 and the front end 101. Free end of the orientating peg 13 is a hook 131. When the cover 1 and the base 2 are assembled to the insulative housing 5, each orientating peg 13 is received in the corresponding orientating hole 27 and each hook 131 of the orientating peg 13 lock the block 271 of the orientating hole 27 so as to enhance the cover 1 and the base 2 assembling. And because the long direction of the orientating hole 27 is parallel with the first direction and have enough space to let the orientating peg 13 move therein, sliding of the cover 1 is not affected.

The cover 1 respectively defines an elliptic elongated hole 14 between the rear boundary of the terminal-receiving area 10 and the rear end 102 corresponding to the elliptic protrusion 44 of the slider 4. The direction of the long axis of the elliptic elongated hole 14 is the same with that of the elliptic protrusion 44. When the cover 1 and the base 2 are assembled to the insulative housing 5, each elliptic protrusion 44 protrudes the corresponding elliptic elongated hole 14 and fastens with the elongated hole 14 in the first direction. The front surface 444 of the elliptic protrusions 44 clings to the front wall of the elliptic elongated hole 14 and the elliptic elongated hole 14 is longer than the elliptic protrusion 44 in X-axis direction. Therefore when the slider 4 displaces, the elliptic protrusion 44 protrudes the corresponding elliptic elongated hole 14 and engages with the elliptic elongated hole 14 in the first direction so as to drive the cover 1 to displace.

In assembly, first, the second arm 32 of the drive means 3 is put in the securing slot 26 of the base 2, the cam member 321 is in the transverse recess 243 and free end of the second arm 32 extends into the base 2. After that, the slider 4 assembled with the wearable member 47 in the U-shaped groove 45 thereof is put in the recess portion 24 and the cam member 321 of the drive means 3 is in the U-shaped wearable member 47, and then, the cover 1 engages the base 2. The first arm 31 of the drive means 3 is in the receiving base 25 of the rear end 202 of the base 2 and pivots from the left to the right and reverse. When the first arm 31 pivots to the right, part of the first arm 31 is received in the elongate groove 251 so that the first arm 31 supports the rear end 202 of the base 2. When the cover 1 engages the base 2, the receiving grooves 121 of left and right vertical portions 12 of the cover 1 lock the corresponding cuneal portion 22 of the base 2 to prevent the cover 1 breaking away from the base 2. Each orientating peg 13 of the cover 1 is received in the corresponding orientating hole 27 and each hook 131 of the orientating peg 13 locks the block 271 of the orientating hole 27 so as to enhance the cover 1 and the base 2 assembling and not affect the cover 1 moving. The posts 23 at the left and the right side of the rear end 202 of the base 2 prevent the cover 1 relatively excessively backwards displacing. When the cover 1 and the base 2 are assembled to the insulative housing 5, each elliptic protrusion 44 of the base 2 protrudes the corresponding elliptic elongated hole 14 of the cover 1 and fastens with the elongated hole 14 in the first direction. Therefore when the slider 4 displaces, the elliptic protrusion 44 protrudes the corresponding elliptic elongated hole 14 and engages with the elliptic elongated hole 14 in the first direction so that the front surface 444 can drive the cover 1 to displace.

When a CPU (not shown) is placed on the cover 1, pins of the CPU respectively inserts in the through holes 11 and extends in the corresponding terminal-receiving cavity 21 of the base 2. The pin of the CPU does not contact with a conductive terminal (not shown) received in the terminal-receiving cavity 21 of the base 2 so it does no need a force that the CPU is assembled onto the cover 1 of the ZIF electrical connector 1. It is the reason of "ZIF". The drive means 3 pivots to make the cover 1 displace relatively to the base 2 along the first direction so that the pins of the CPU contact with the conductive terminal received in the terminal-receiving cavity 21 of the base 2.

Figure 7:
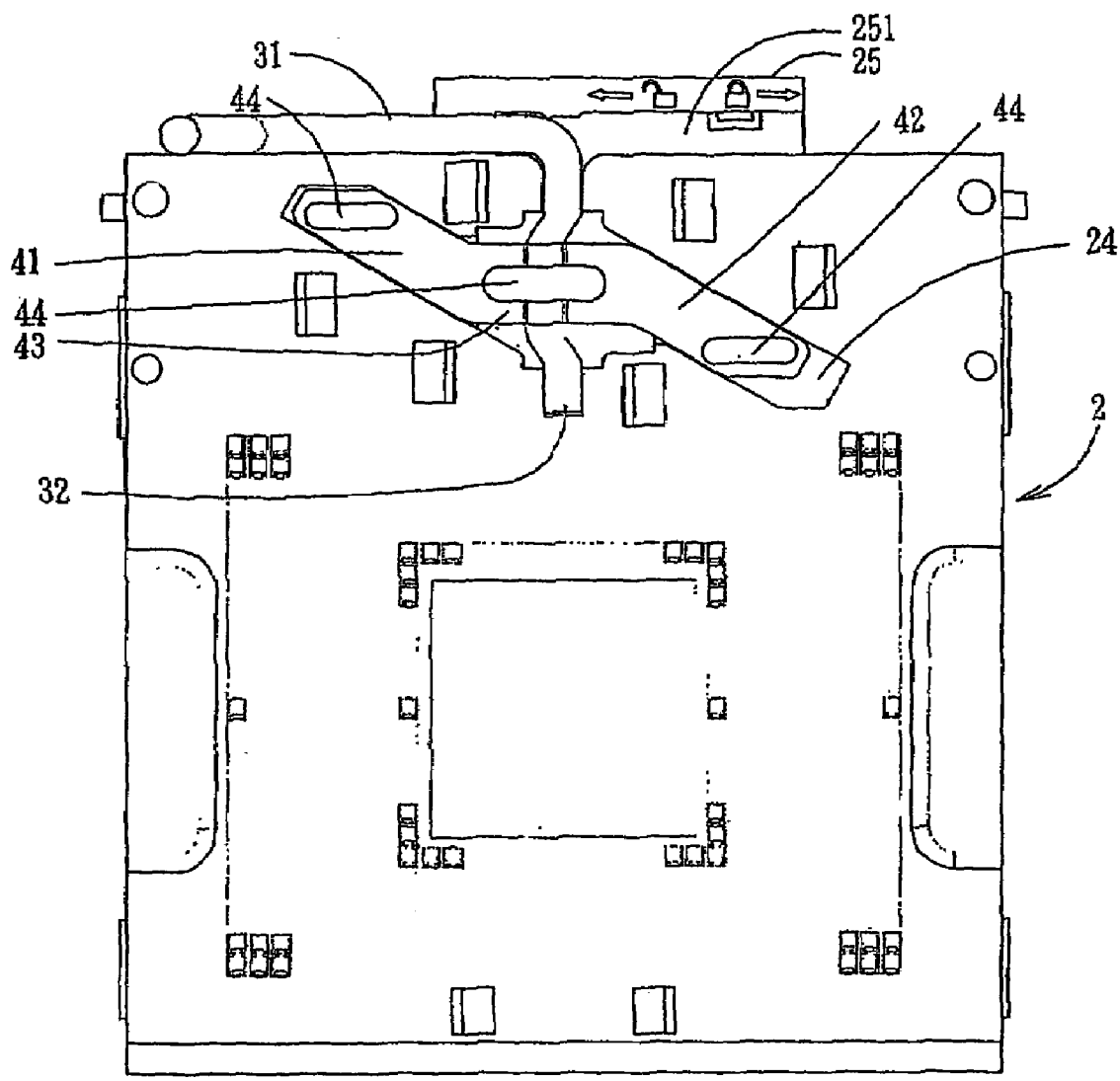
FIG. 7 is a perspective-assembled view of FIG. 4 in which the drive means turns to the left and the slider is in top left corner of a recess portion of the base.
Figure 8:
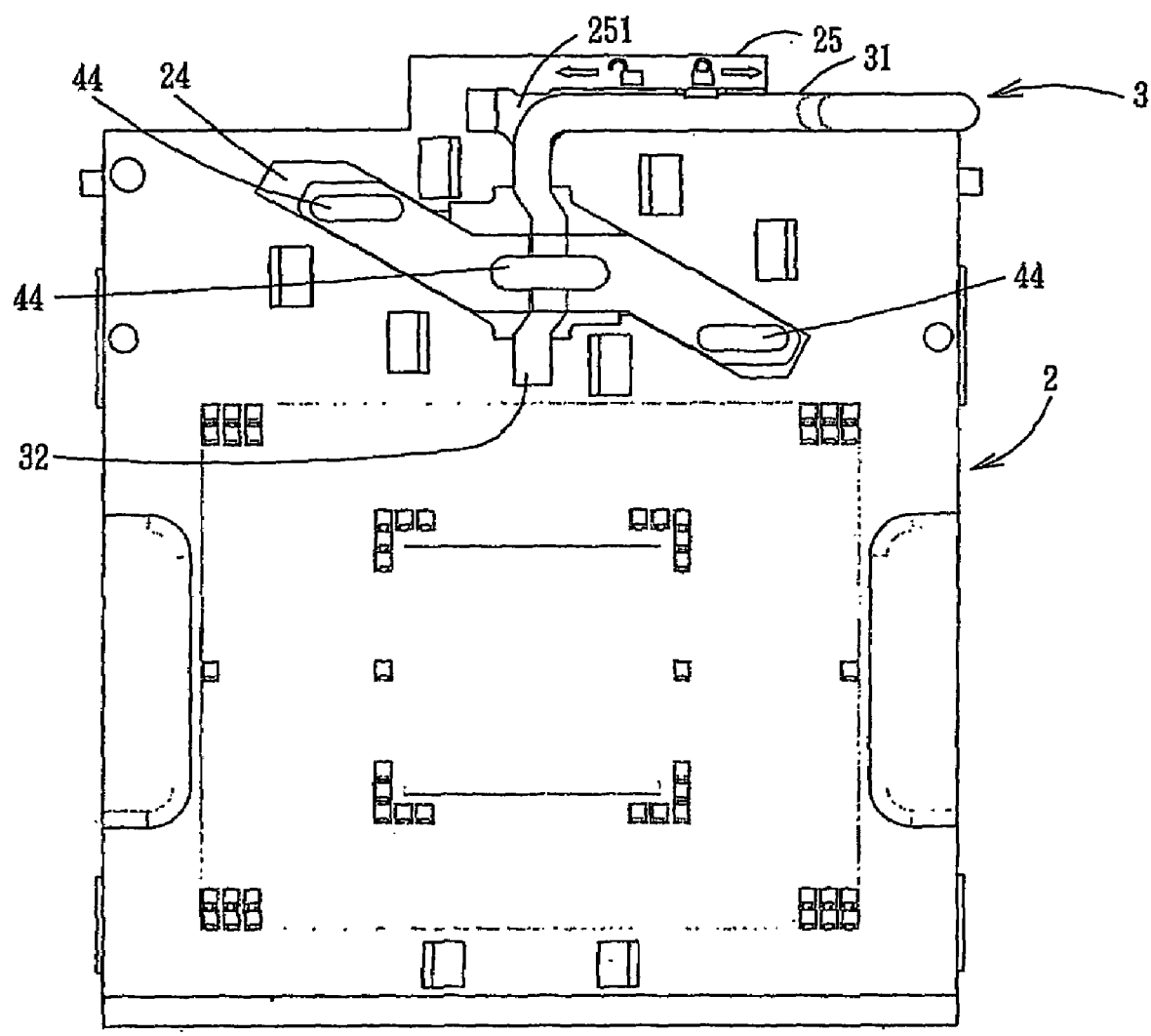
FIG. 8 is a perspective-assembled view of FIG. 4 in which the drive means turns to the right and the slider is in bottom right corner of a recess portion of the base.
Figures 1, 9:
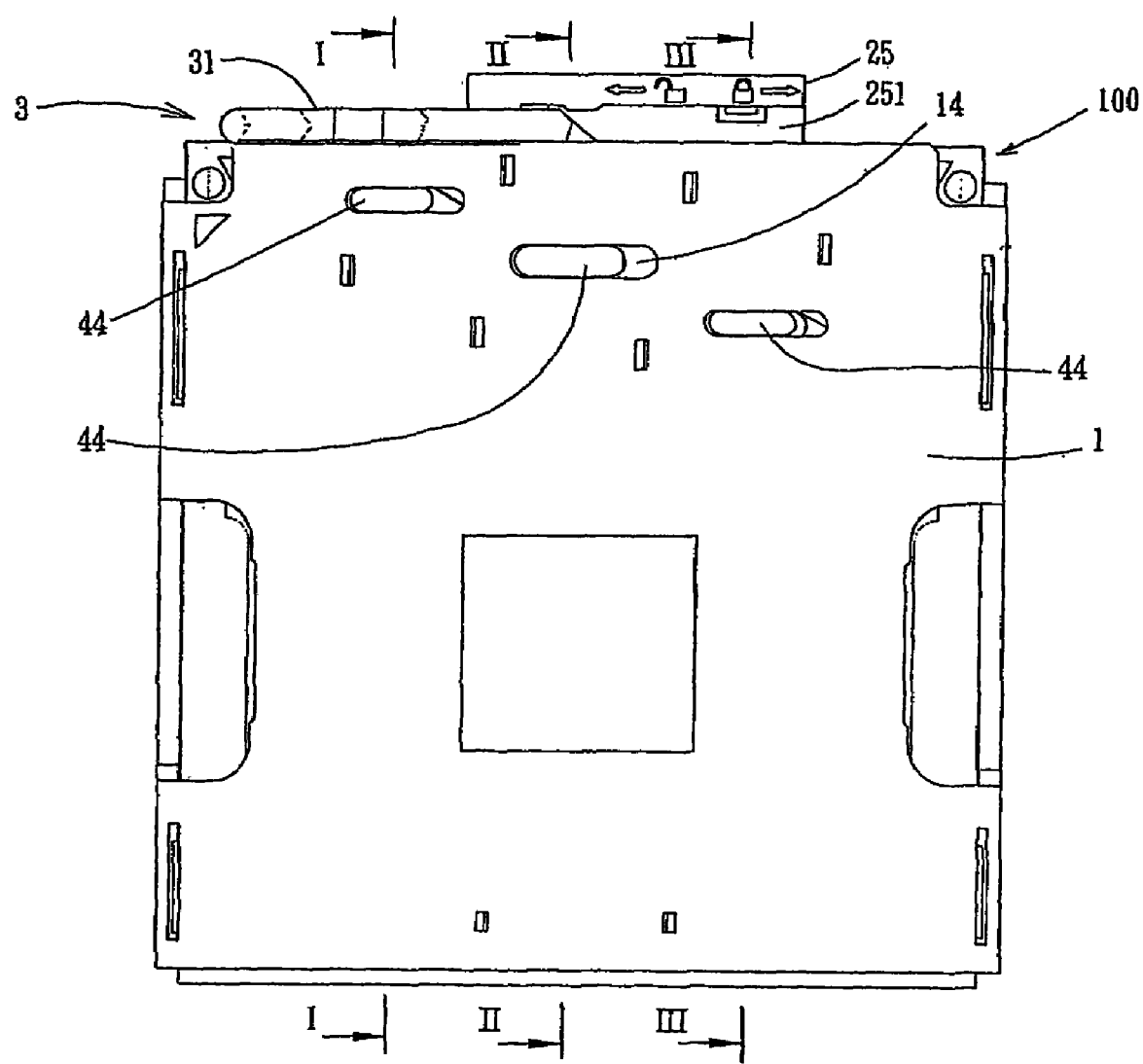
Figures 1, 10:
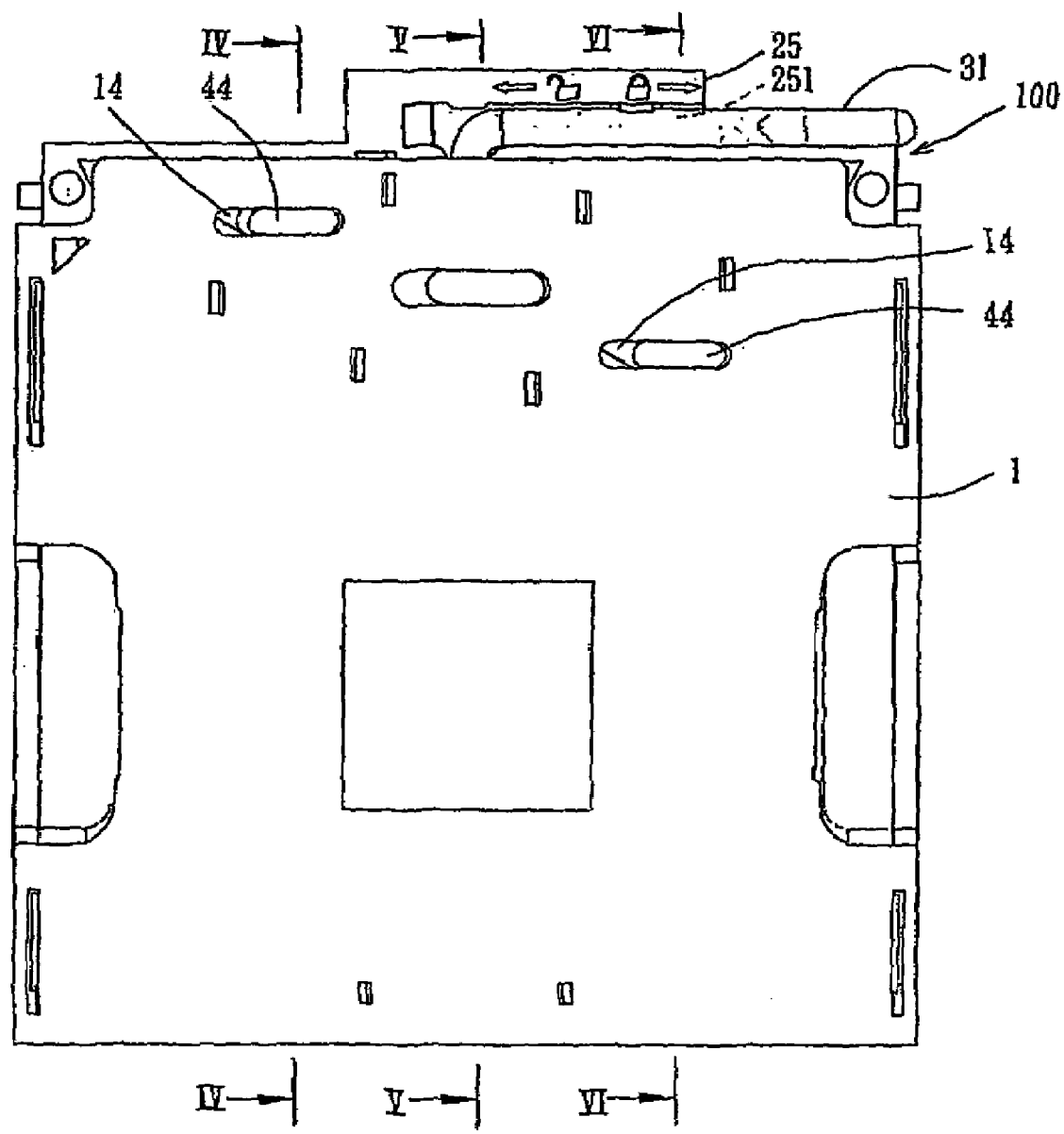
Figure 11:
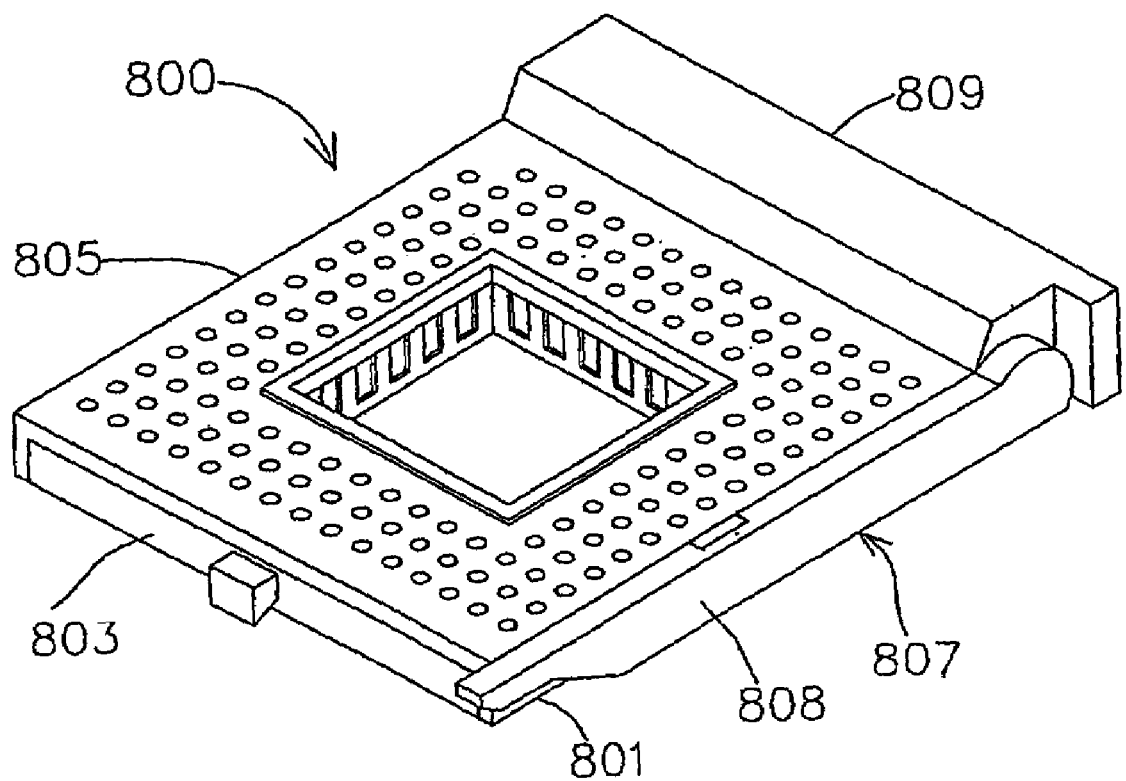
FIG. 11 is a perspective view of a conventional ZIF electrical connector.
Figure 12:
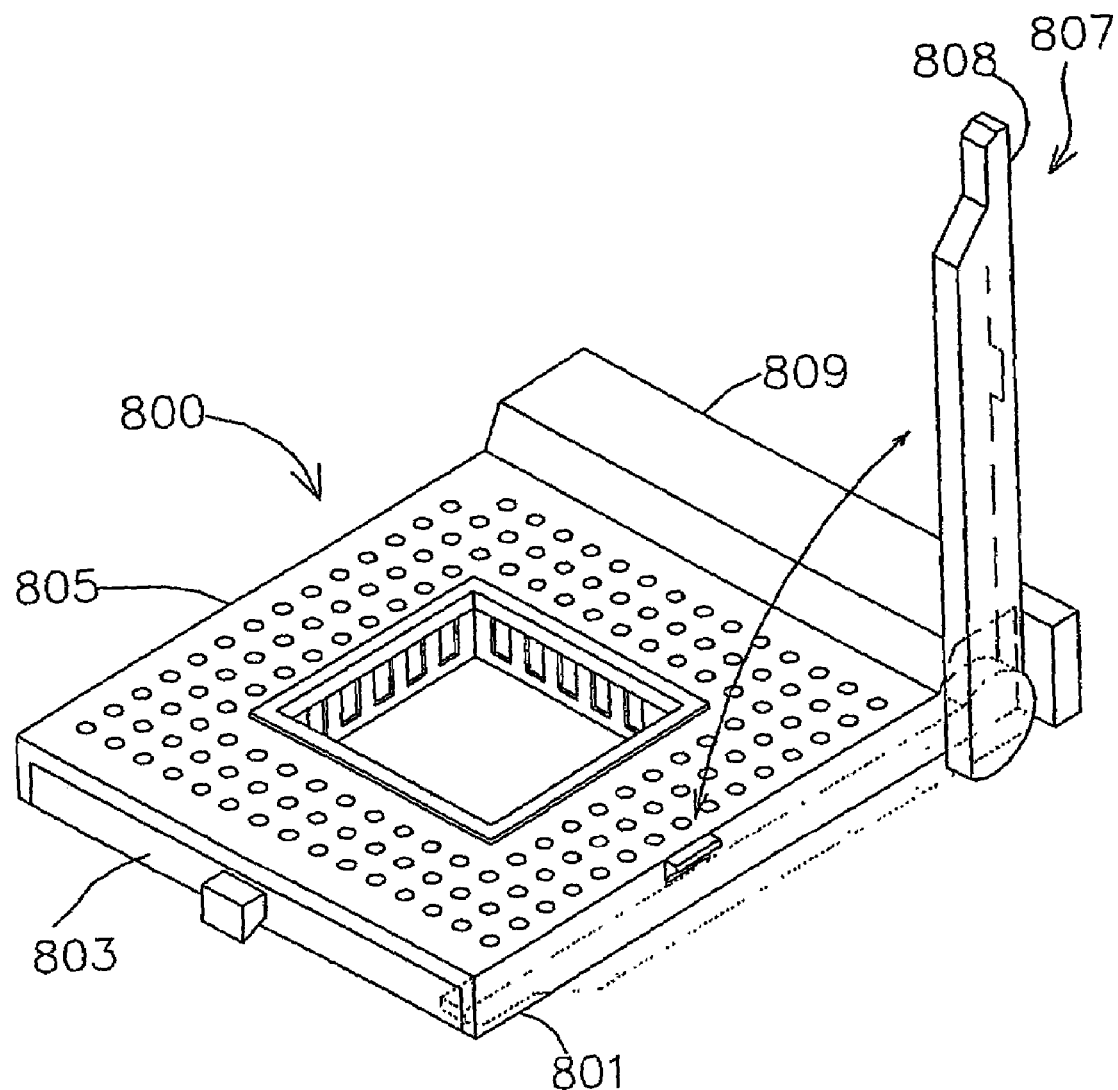
FIG. 12 is a perspective view of a conventional ZIF electrical connector in which the drive means pivots.

Referring to FIG. 7 and FIG. 8, after the drive means 3 and the slider 4 assembled with the wearable member 47 are located in the base 2, when the first arm 31 of the drive means 3 pivot to the left, the slider 4 is at the top left of the recess portion 24 (referring to FIG. 7); when the first arm 31 of the drive means 3 pivots from the left to the right, the slider 4 slant displaces from the top left to the bottom right of the recess portion 24 (referring to FIG. 8). After the cover 1 engages the base 2, it will be illuminated how the cover 1 relatively displace to the base 2 along the first direction through FIGS. 9–1 to 94 and FIGS. 10–1 to 10–4. FIGS. 9–1 shows the cover 1 at the first position. When the first arm 31 of the drive means 3 pivots to the left, the slider 4 is at the top left of the recess portion 24 (referring to FIG. 7), the CPU (not shown) is placed on the cover 1, pins of the CPU respectively inserts in the through holes 11 and extends in the corresponding terminal-receiving cavity 21 of the base 2. The pin of the CPU does not contact with a conductive terminal received in the terminal-receiving cavity 21 of the base 2; FIGS. 9–2 to 9–4 respectively shows the cover 1 does not displace to the base 2. FIGS. 10–1 shows the cover 1 at the second position and the first arm 31 of the drive means 3 pivots from the left to the right. Because the recess portion 24 is thicker than the slider 4 in Z-axis direction, the cover 1 will not press the slider 4 and let the slider 4 not move. When the drive means 3 pivots, the cam member 321 turns following the drive means 3 and pushes up the slider 4. Though the slider 4 is pushed up to the culmination, the slider 4 still can displace. The slider 4 only can displace along the recess portion 24 from the top left to the bottom right because the slider 4 is covered with the cover 1 and limited by the slant recess portion 24 between left and right. When the slider 4 displaces, the elliptic protrusion 44 protruding the corresponding elliptic elongated hole 14 also displace in Y-axis direction. The front surface 444 of the elliptic protrusion 44 drives the cover 1 to displace forward along the first direction so that the CPU assembled on the cover 1 synchronously move forward and pins (not shown) of the CPU contact with the conductive terminal (not shown) received in the terminal-receiving cavity 21 of the base 2. FIGS. 10–2 to 10–4 respectively shows the cover 1 forward displace to the base 2.

When the cover 1 moves from the second position back to the first position, the first arm 31 of the drive means 3 pivots from the right to the left and the slider 4 displace along the recess portion 24 from the bottom right to the top left. When the slider 4 displaces, the elliptic protrusion 44 protruding the corresponding elliptic elongated hole 14 also displaces in Y-axis direction so as to drive the cover 1 to displace rearward along the first direction. The CPU assembled on the cover 1 synchronously move rearward and pins (not shown) of the CPU do not contact with the conductive terminal (not shown) received in the terminal-receiving cavity 21 of the base 2.

In the above embodiment, the recess portion 24 comprises the first slant recess 241, the second slant recess 242 and the transverse recess 243 connecting with two slant recesses 241, 242. But, the recess portion 24 also can be designed a slant recess pointing to the second direction and no transverse recess 243. The slider 4 also can be designed in the same way to engage the recess portion 24.

The CPU has many pins and if each pin does not accurately contact with the conductive terminal, the CPU can not work. Therefore, it is very important to make the displacement of each part of the cover 1 accordant. Illuminated as above, the elliptic protrusions 44 and elliptic elongated hole 14 of the ZIF electrical connector 100 of the present invention are all paralleled to the X-axis direction (vertical to the first direction). The surface making the elliptic protrusions 44 forward and vertical to the first direction will make the front surface 444 of the elliptic protrusion 44 entirely connect with the cover 1. When driving the cover 1 to displace forward along the first direction, the whole front surface of the elliptic protrusion 44 drives the cover 1. Because the forward direction driving is assured, each part of the cover 1 displaces accordant so as to enhance each pin of the CPU accurately to contact with the conductive terminal. The drive means of the ZIF electrical connector of the present invention is defined on one side of the insulative housing crossing the first direction which accords with new specification brought by IC manufacturer. The drive means of the ZIF electrical connector of the present invention indirectly drive the cover of the ZIF electrical connector and make the cover displacement, and the slider moves along a direction slant with the moving direction of the cover, all the above are different from the prior art.

Although the present invention has been illustrated and described with respect to exemplary embodiment thereof, it should be understood by those skilled in the art that the various changes, omissions and additions may be made therein and thereto without departing from the spirit and scope of the present invention as set forth in the appended claims.

What is claimed is:

1. A ZIF electrical connector, comprising:
an insulative housing having a cover slideably assembling onto a base, the base defining a plurality of terminal-receiving cavities, the cover moving between a first position and a second position and along a first direction, and defining a plurality of through holes corresponding to the terminal-receiving cavities, the base defining a recess portion partly slant with the first direction;
a plurality of conductive terminals received in the terminal-receiving cavities;
a slider moving in the recess portion and having a body and part of the body intervening with the cover; and
a drive means having a first arm for driving the slider, wherein the slider includes a plurality of generally elliptical protrusions, the elliptical protrusions having a long axis that is generally parallel to the first arm.

2. The ZIF electrical connector as claimed in claim 1, wherein the recess portion has a first slant recess, a second slant recess and a transverse recess connecting with the first and second slant recesses, and the slope of the first and second slant recess is all same with that of the second direction.

3. The ZIF electrical connector as claimed in claim 1, wherein the body of the slider has a first body, a second body and a transverse body connecting with the first body and the second body, the first body is enough received in the first slant recess, the second body is enough received in the second slant recess and the transverse body is enough received in the transverse recess.

4. The ZIF electrical connector as claimed in claim 1, wherein the drive means is a pole and has an operating portion defined at side of the insulative housing crossing the first direction and a cam member contacting with the transverse body, when the operating portion pivots, the operating portion drives the cam member to turn.

5. The ZIF electrical connector as claimed in claim 4, wherein the transverse recess is defined along the direction vertical to the first direction.

6. The ZIF electrical connector as claimed in claim 1, wherein the cover defines an elongated hole corresponding the protrusion of the slider to receive the protrusion.

7. The ZIF electrical connector as claimed in claim 6, wherein the protrusions are respectively formed on the first body, the second body and the transverse body and the cover respectively defines an elongated hole corresponding to each protrusion of the slider.

8. The ZIF electrical connector as claimed in claim 7, wherein the protrusion engages with the elongated hole in the first direction.

9. The ZIF electrical connector as claimed in claim 4, wherein the base extends a receiving base from side of the drive means extending in the insulative housing and the receiving base defines an elongate groove vertical to the first direction to receive the operating portion of the drive means.

10. The ZIF electrical connector as claimed in claim 9, wherein the receiving base connects with the transverse recess through a securing slot along the first direction and the drive means extends in the insulative housing along the securing slot.

11. The ZIF electrical connector as claimed in claim 1, wherein the base respectively defines a post at two opposite corners of side of the drive means extending in the insulative housing.

12. The ZIF electrical connector as claimed in claim 4, wherein the transverse body depresses a U-shaped groove along a short axis thereof near the base to receive the cam member of the drive means.

13. The ZIF electrical connector as claimed in claim 12, wherein the ZIF electrical connector further comprises a wearable member U-shaped and made of metal and received in the U-shaped groove of the transverse body, each side of the U-shaped groove defines a plurality of securing holes, and the U-shaped sidewalls of the wearable member respectively integrated extend a plurality of securing legs corresponding to insert in the securing holes to fasten the wearable member.

14. The ZIF electrical connector as claimed in claim 1, wherein the base defines a plurality of orientating holes, each orientating hole transverse defines a block and the block is not close the orientating hole, the face of the cover near the base respectively downward defines an orientating peg corresponding to the orientating hole of the base, free end of the orientating peg is a hook, each orientating peg is received in the corresponding orientating hole and each hook of the orientating peg lock the block of the orientating hole.

* * * * *